United States Patent
Kondo et al.

(10) Patent No.: US 8,669,478 B2
(45) Date of Patent: Mar. 11, 2014

(54) WIRING SUBSTRATE AND METHOD OF MANUFACTURING THE SAME

(75) Inventors: Hitoshi Kondo, Nagano (JP); Tomoyuki Shimodaira, Nagano (JP); Masako Sato, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 193 days.

(21) Appl. No.: 13/158,607

(22) Filed: Jun. 13, 2011

(65) Prior Publication Data

US 2011/0308849 A1    Dec. 22, 2011

(30) Foreign Application Priority Data

Jun. 18, 2010   (JP)  ................. 2010-138906

(51) Int. Cl.
*H05K 1/16*     (2006.01)

(52) U.S. Cl.
USPC ........................................................ 174/260

(58) Field of Classification Search
USPC ........................................................ 174/260
See application file for complete search history.

(56) References Cited

U.S. PATENT DOCUMENTS

| | | | | |
|---|---|---|---|---|
| 6,228,466 B1 * | 5/2001 | Tsukada et al. | ............... | 428/209 |
| 6,326,559 B1 * | 12/2001 | Yoshioka et al. | ............. | 174/261 |
| 2006/0042824 A1 * | 3/2006 | Takada et al. | ................. | 174/250 |
| 2006/0283625 A1 * | 12/2006 | Yamamichi et al. | .......... | 174/255 |
| 2009/0095514 A1 * | 4/2009 | Kaneko | ........................ | 174/258 |

FOREIGN PATENT DOCUMENTS

JP    2002-171050 A1    6/2002
JP    2008-257044 A1    10/2008

* cited by examiner

*Primary Examiner* — Chau Nguyen
(74) *Attorney, Agent, or Firm* — Kratz, Quintos & Hanson, LLP

(57) ABSTRACT

A wiring substrate includes a first insulating layer formed as an outermost layer on one surface side, and exhibiting a black color or a gray color, a first connection pad formed to expose from the first insulating layer, a second insulating layer formed as an outermost layer on another surface side, and exhibiting a black color or a gray color, and a second connection pad formed to expose from the second insulating layer, wherein a connection hole having a side wall surface formed like a curved surface is formed in the second insulating layer, and the second connection pad is exposed to a bottom part of the connection hole.

10 Claims, 17 Drawing Sheets discoloration of solder resist 300 by heating process in the case of laser processing
(comparative example)

the embodiment (wet blasting)

in the case of laser processing
(comparative example)

the embodiment (wet blasting)

WIRING SUBSTRATE AND METHOD OF MANUFACTURING THE SAME

CROSS-REFERENCE TO RELATED APPLICATIONS

This application is based upon and claims the benefit of priority of the prior Japanese Patent Application No. 2010-138906, filed on Jun. 18, 2010, the entire contents of which are incorporated herein by reference.

FIELD

It is related to a wiring substrate and a method of manufacturing the same.

BACKGROUND

In the prior art, there exists the multilayer wiring substrate for mounting a semiconductor chip. In the multilayer wiring substrate, the chip connection pads for mounting the semiconductor chip are provided on one surface, and the external connection pads for connecting external connection terminals are provided on the other surface.

In Patent Literature 1 (Japanese Laid-Open Patent Publication No. 2002-171050), it is set forth that, in the printed wiring board in which the pads for joining the connection terminals are provided on a surface of the insulating substrate, the surface of the insulating substrate including the outer peripheral parts of the connection pads is coated with the black solder resist, whereby the heat can be radiated effectively from the electronic components.

Also, in Patent Literature 2 (Japanese Laid-Open Patent Publication No. 2008-257044), it is set forth that, in the solder resist used in the printed wiring board, or the like, when the solder resist which has excellent heat resistance and a little warp is employed, such a matter is effective that the white or black solder resist that needs to increase the amount of exposure should be used together in order to enhance a resolution.

As described later, in the wiring substrate in the related art, the solder resist is formed on the outermost area of the wiring substrate such that the connection pads are exposes, and generally the solder resist exhibits the color in green series. The semiconductor chip is flip-chip connected to the connection pads of the wiring substrate by the soldering.

In the wiring substrate in the related art, such a problem exists that the solder resist is oxidized by the heating process applied when the semiconductor chip is flip-chip connected, or the like and is easily discolored into a brown color. In the case that the solder resist is discolored, not only its appearance becomes worse, but also when the alignment is performed by the image recognition in the later assembling step, the contrast of the image becomes worse, and thus sometimes the alignment becomes difficult.

SUMMARY

According to one aspect discussed herein, there is provided a wiring substrate, which includes a first insulating layer formed as an outermost layer on a one surface side, and exhibiting a black color or a gray color, a first connection pad formed to expose from the first insulating layer, a second insulating layer formed as an outermost layer on another surface side, and exhibiting a black color or a gray color, and a second connection pad formed to expose from the second insulating layer, wherein a connection hole having a side wall surface formed like a curved surface is formed in the second insulating layer, and the second connection pad is exposed to a bottom part of the connection hole.

According to another aspect discussed herein, there is provided a method of manufacturing a wiring substrate, which includes forming an insulating layer which exhibits a black color or a gray color and covers a connection pad, on a wiring substrate including the connection pad, forming a resist in which an opening portion is arranged on the connection pad, on the insulating layer, and forming a connection hole reaching the connection pad, in the insulating layer through the opening portion in the resist by a wet blasting method.

DESCRIPTION OF EMBODIMENTS

Embodiments will be explained with reference to the accompanying drawings hereinafter.

RELATED ART

Figure 1:
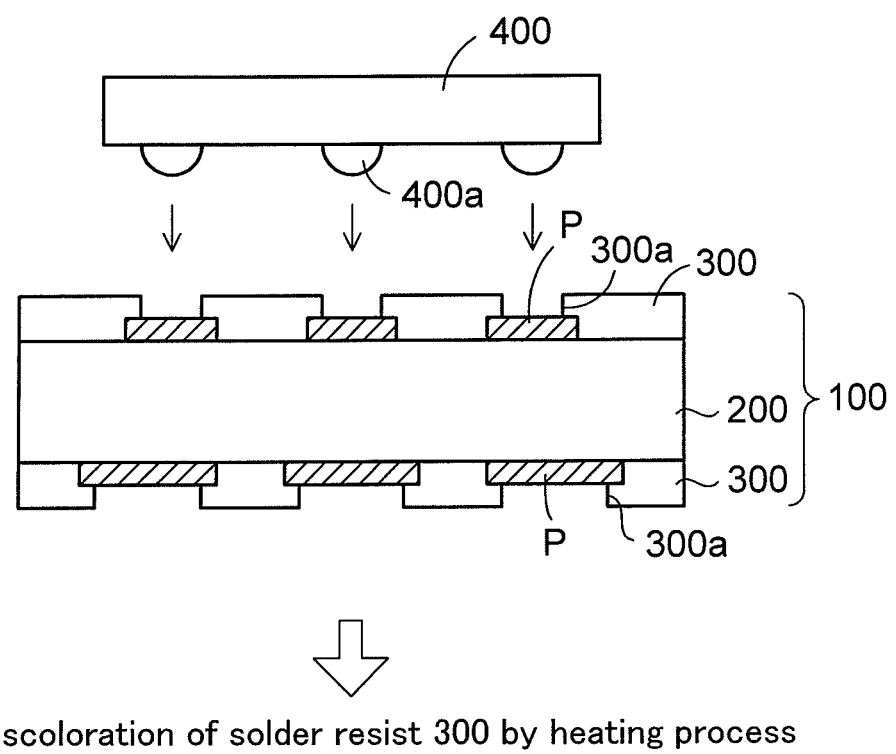
FIG. 1 is a sectional view explaining problems in a wiring substrate in the related art.

Prior to the explanation of embodiments, the related art (preliminary matter) will be explained hereunder. FIG. 1 is a sectional view depicting a wiring substrate in the related art.

As depicted in FIG. 1, in a wiring substrate 100 in the related art, connection pads P are provided on both surface sides of a multilayer wiring portion 200 respectively, and a solder resist 300 in which opening portions 300a each of which exposes the connection pad P are provided, is formed on both surface sides respectively. Generally, the solder resist 300 exhibits a color in the green series.

Then, bump electrodes 400a of a semiconductor chip 400 are flip-chip connected to the connection pads P of the wiring substrate 100 by the soldering. At this time, such a problem exists that the solder resist 300 is oxidized by the heating process during the soldering and is easy to discolor into brown color.

Also after the semiconductor chip 400 is mounted on the wiring substrate 100, there are the steps in which various heating processes, such as the curing step based on heating an underfill resin which is filled between the semiconductor chip 400 and the wiring substrate 100, etc. are performed. Thus, there is such a tendency that the discoloration becomes conspicuous as the heating process is repeated.

In case the solder resist 300 is discolored, not only its appearance becomes worse, but also when the alignment is performed by the image recognition in the later assembling step (fitting a reinforcing plate, a radiating plate, etc.), the contrast of the image becomes worse, and thus sometimes the alignment becomes difficult.

As the inventor's earnest study to the above problem, the inventor of this application found the fact that the discoloration caused by the heating process can be prevented by setting a color of the solder resist to an achromatic color of a black or gray color.

First Embodiment

Figure 4A:
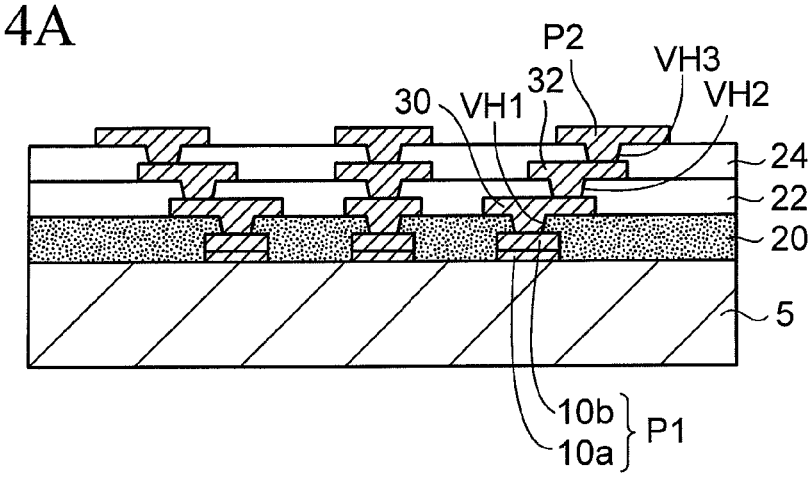
FIGS. 4A to 4C are sectional views (#3) depicting the method of manufacturing the wiring substrate according to the first embodiment.
Figure 4B:
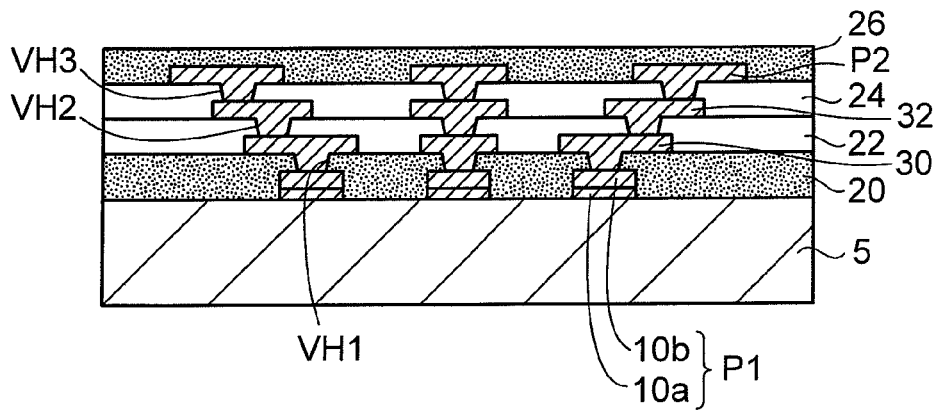
Figure 4C:
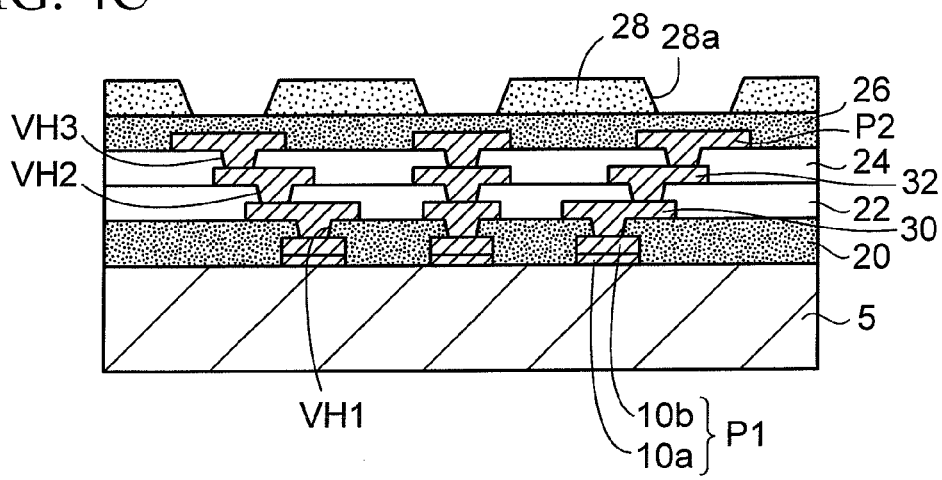
Figure 5A:
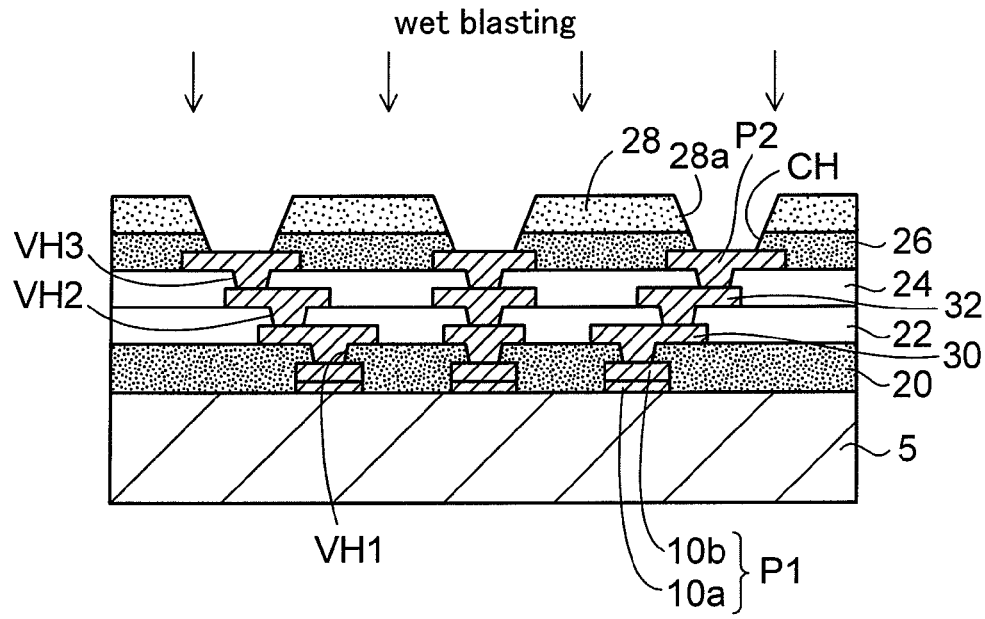
FIGS. 5A to 5D are sectional views (#4) depicting the method of manufacturing the wiring substrate according to the first embodiment.
Figure 5B:
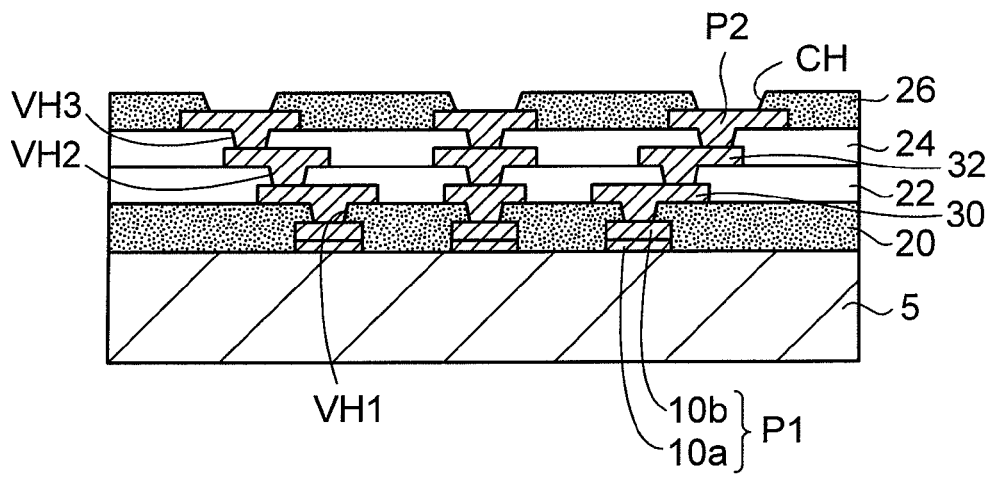
Figure 5C:
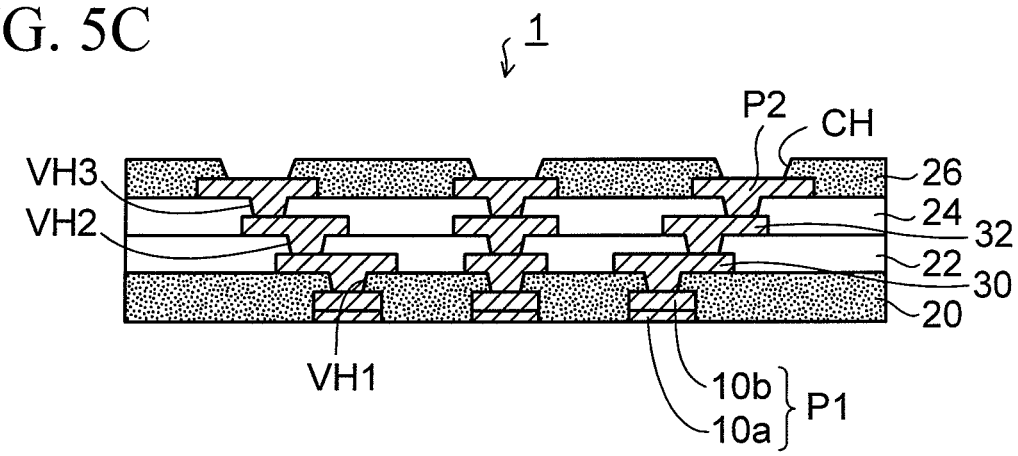
Figure 5D:
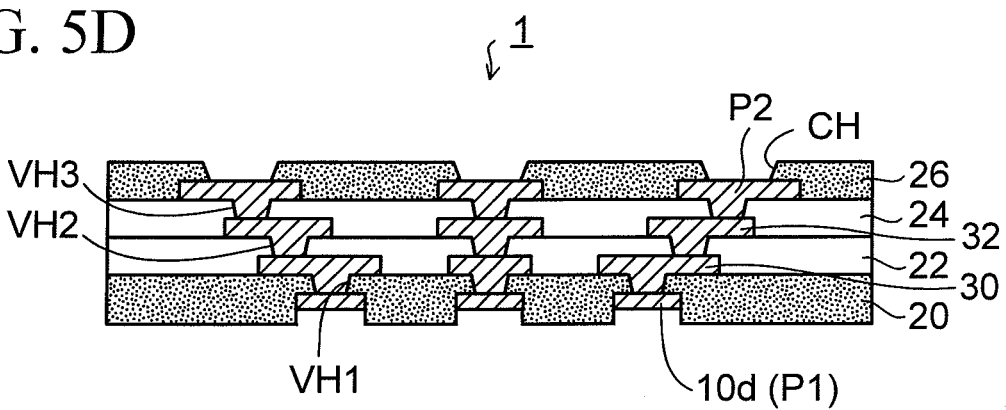
Figure 6A:
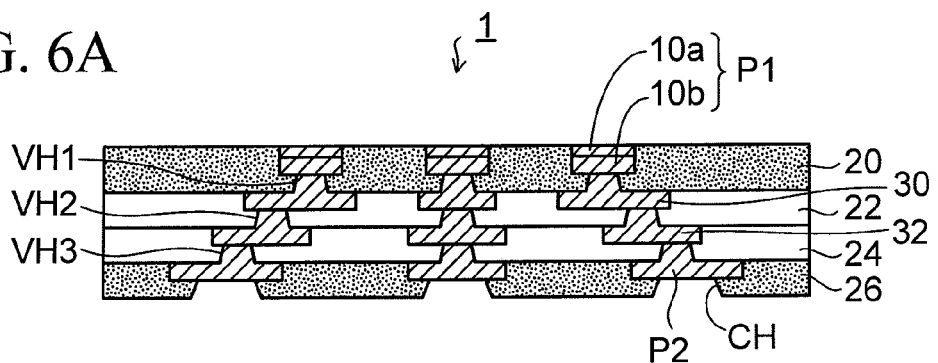
FIGS. 6A to 6C are sectional views depicting a method of mounting a semiconductor chip on the wiring substrate according to the first embodiment.
Figure 6B:
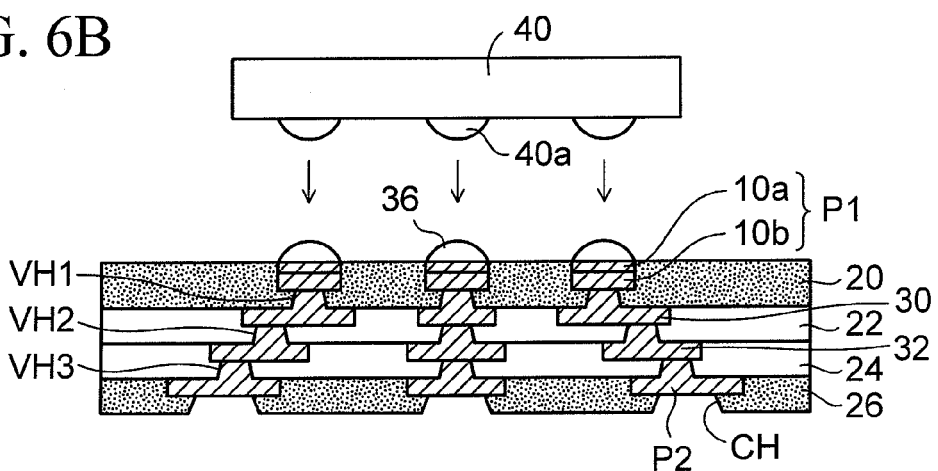
Figure 6C:
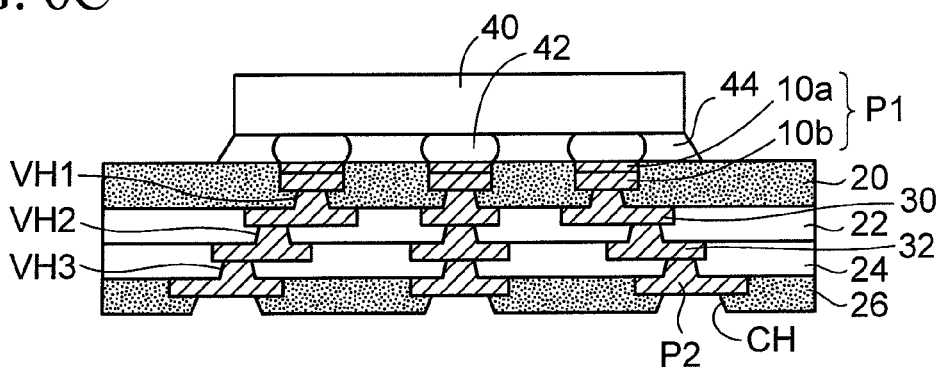

FIG. 2A to FIG. 5C are sectional views depicting a method of manufacturing a wiring substrate according to a first embodiment, and FIGS. 6A to 6C are sectional views depicting a method of mounting a semiconductor chip on the wiring substrate according to the first embodiment.

In the first embodiment, such a mode will be explained with reference to a manufacturing method hereinafter that in a coreless wiring substrate which has no core substrate, a color of an insulating layer (solder resist) on both surface sides is set to an achromatic color of a black or gray color.

Figure 2A:
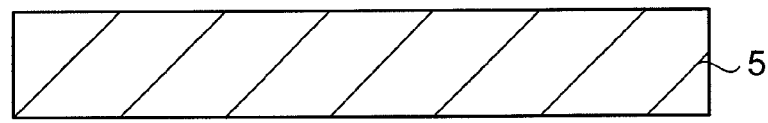
FIGS. 2A to 2D are sectional views (#1) depicting a method of manufacturing a wiring substrate according to a first embodiment.

As depicted in FIG. 2A, first, a supporting body 5 formed of a metal plate or a metal foil of copper (Cu), or the like is prepared. The supporting body 5 is a temporary substrate, and is removed after a build-up wiring is formed on the supporting body 5.

Figure 2B:
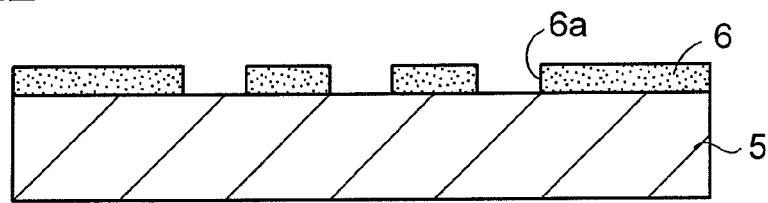
Figure 2C:
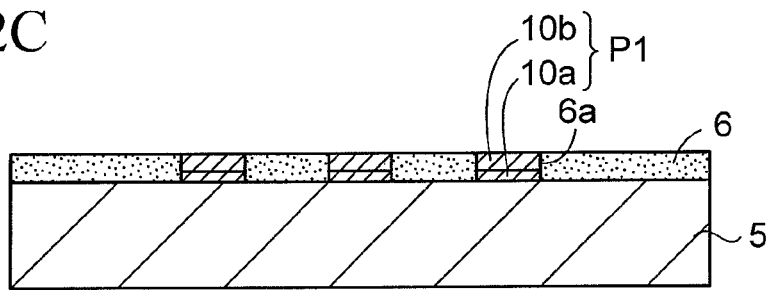

Then, as depicted in FIG. 2B, a plating resist 6 in which opening portions 6a are provided on the parts where a chip connection pads are arranged is formed on the supporting body 5. Then, as depicted in FIG. 2C, a gold (Au) layer 10a and a nickel (Ni) layer 10b are formed on the supporting body 5 in the opening portions 6a of the plating resist 6 sequentially by the electroplating utilizing the supporting body 5 as a plating power feeding path. Then, the plating resist 6 is removed.

Figure 2D:
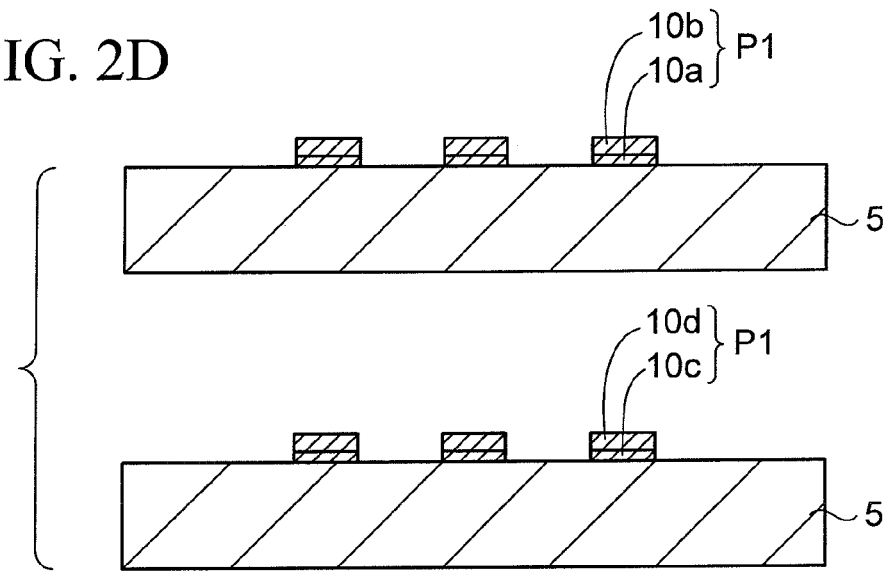

Accordingly, as depicted in an upper view of FIG. 2D, chip connection pads P1 (first connection pads (or lower connection pads)) each composed of the gold (Au) layer 10a and the nickel (Ni) layer 10b are formed on the supporting body 5.

Otherwise, as the chip connection pad P1, various laminated films such as a gold (Au) layer/a nickel (Ni) layer/a copper (Cu) layer, a gold (Au) layer/a palladium (Pd) layer/a nickel (Ni) layer, a gold (Au) layer/a palladium (Pd) layer/a nickel (Ni) layer/a copper (Cu) layer, or the like may be formed on the supporting body 5 sequentially from the bottom.

Alternatively, as depicted in a lower view of FIG. 2D as the chip connection pad P1, a nickel (Ni) layer 10c (sacrifice layer)/a copper (Cu) layer 10d may be formed on the supporting body 5 sequentially from the bottom. In this case, as described later, the nickel (Ni) layer (sacrifice layer) is removed by the etchant that can etch selectively the nickel after the supporting body 5 is removed, and thus the chip connection pad P1 is formed only of the copper (Cu) layer.

The chip connection pads P1 are electrodes to which a semiconductor chip is connected, and are shaped into a circle respectively, for example, when viewed from the top. A diameter of the chip connection pad P1 is set to 50 to 100 μm, and an arrangement pitch of the chip connection pads P1 is set to 90 to 150 μm.

Figure 3A:
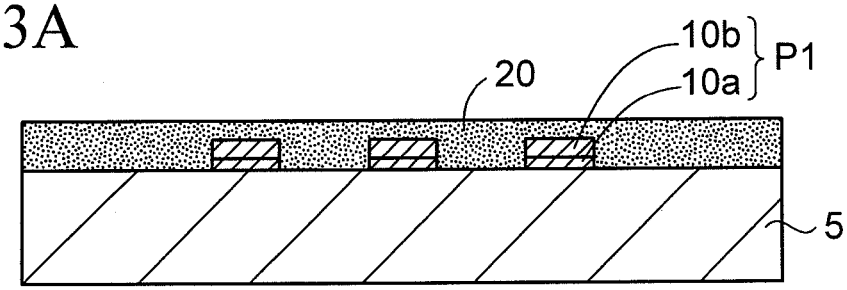
FIGS. 3A to 3D are sectional views (#2) depicting the method of manufacturing the wiring substrate according to the first embodiment.

Then, as depicted in FIG. 3A, a first black insulating layer 20 (lower insulating layer exhibiting a black color or a gray color) which covers the chip connection pads P1 is formed on the supporting body 5. The first black insulating layer 20 is shown as an example, but a gray color, a dark gray color near the black color, or the like may be employed. That is, any insulating layer which exhibits an achromatic color between a gray color and a black color may be formed. The first black insulating layer 20 functions as a solder resist.

As the insulating layer in an achromatic color between a black color or a gray color, the insulating layer that the optical absorptance of a visible light whose wavelength is 380 to 780 nm is 60% or more (preferably, 70% or more) to 100%, is employed.

The insulating layer whose optical absorptance is 60% or more but less than 70% is seen as a gray color (or a dark gray color), and the insulating layer whose optical absorptance is 70% or more is seen as a black color.

The insulating layer in a black color or a gray color is obtained by mixing any one of following pigments or their combined pigments into a resin such as epoxy, polyimide, or the like. As such pigment, there is carbon black series, graphite series, iron oxide series, anthraquinone series, cobalt oxide series, copper oxide series, manganese series, antimony oxide series, nickel oxide series, perylene series, or the like.

A pigment content in the resin is set to 0.01 to 20 weight %, preferably 0.1 to 10 weight %.

For example, the first black insulating layer 20 may be formed by laminating a resin film which is obtained by mixing a black pigment into a thermosetting resin such as epoxy, polyimide, or the like, and then heating and pressuring the laminated resin films by means of the vacuum pressing machine. Otherwise, a liquid thermosetting resin such as an epoxy resin, a polyimide resin, or the like, into which a black pigment is mixed, may be coated, and then may be cured by applying the heating.

Since the first black insulating layer 20 has the characteristic that can absorb easily a light, in many cases it is difficult to form a hole pattern in the first black insulating layer 20 with high precision by the photolithography. Therefore, the first black insulating layer 20 is formed of a non-photosensitive resin, and when forming the opening portions, the first black insulating layer 20 is processed by the laser or the wet blasting method.

Figure 3B:
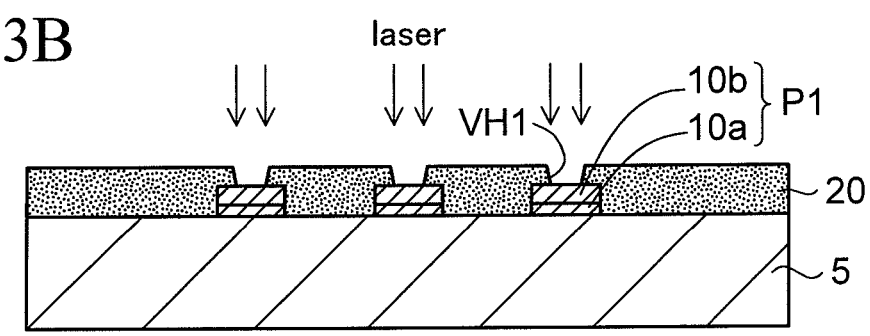
Figure 3C:
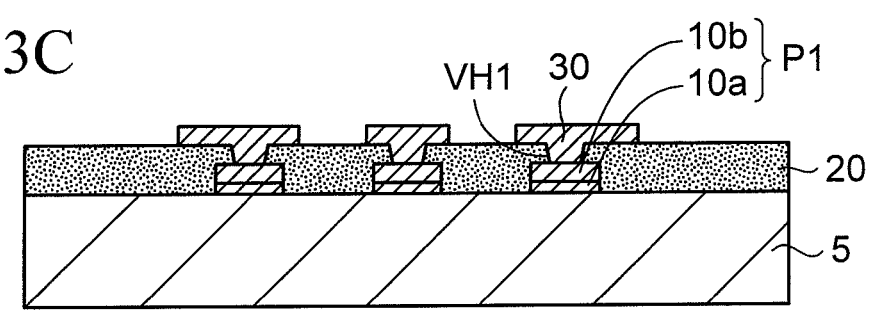

Then, as depicted in FIG. 3B, first via holes VH1 each reaching the chip connection pad P1 are formed by processing the first black insulating layer 20 by means of the laser. Then, as depicted in FIG. 3C, first wiring layers 30 each connected to the chip connection pad P1 via the first via hole VH1 (via conductor) are formed on the first black insulating layer 20.

The first wiring layers 30 are formed by the semi-additive process, for example. To explain in detail, first, a seed layer (not shown) made of copper, or the like is formed on the first black insulating layer 20 and respective inner surfaces of the first via hole VH1 by the electroless plating or the sputter method. Then, a plating resist (not shown) in which an opening portion is provided on parts where the first wiring layer 30 is arranged respectively is formed on the seed layer.

Then, a metal pattern layer (not shown) made of copper, or the like is formed in the opening portions by the electroplating utilizing the seed layer as a plating power feeding path. Then, the plating resist is removed, and then the seed layer is etched while using the metal pattern layers as a mask. Thus, the first wiring layers 30 each composed of the seed layer and the metal pattern layer are obtained.

Figure 3D:
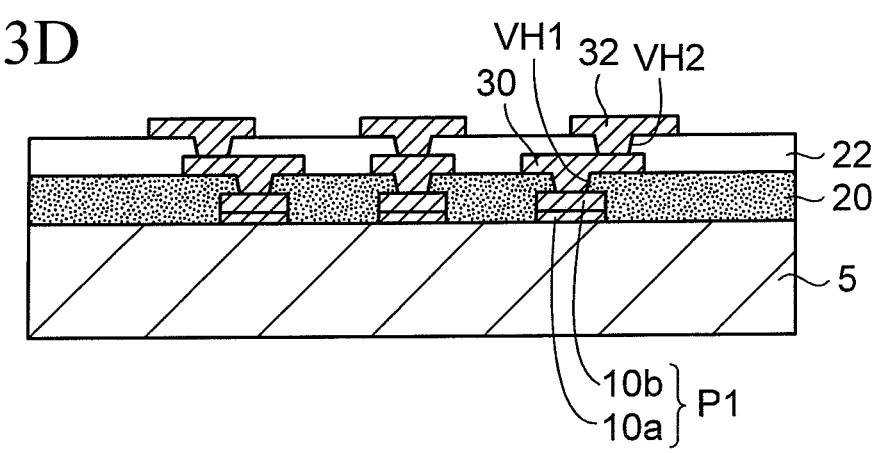

Then, as depicted in FIG. 3D, a first interlayer insulating layer 22 is formed on the first wiring layers 30, and then the first interlayer insulating layer 22 is processed by the laser. Thus, second via holes VH2 each reaching the first wiring layer 30 are formed in the first interlayer insulating layer 22. It is not needed that the first interlayer insulating layer 22 should be colored in a black color or a gray color, and the first interlayer insulating layer 22 is formed of the normal epoxy resin, the normal polyimide resin, or the like.

Then, second wiring layers 32 each connected to the first wiring layer 30 via the second via hole VH2 (via conductor) are formed on the first interlayer insulating layer 22 by the method similar to the method of forming the first wiring layers 30.

Then, as depicted in FIG. 4A, a second interlayer insulating layer 24 is formed on the second wiring layers 32 and the first interlayer insulating layer 22, and then the second interlayer insulating layer 24 is processed by the laser. Thus, third via holes VH3 each reaching the second wiring layer 32 are formed in the second interlayer insulating layer 24. Like the first interlayer insulating layer 22, it is not needed that the second interlayer insulating layer 24 should be colored in a black color or a gray color, and the second interlayer insulating layer 24 is formed of the normal epoxy resin or the normal polyimide resin.

The first interlayer insulating layer 22 and the second interlayer insulating layer 24 described above are formed by laminating a resin film, and then heating and pressuring the laminated resin films by means of the vacuum pressing machine, or the like.

Then, by the method similar to the method of forming the first wiring layers 30, external connection pads P2 (second connection pads) each connected to the second wiring layer 32 via the third via hole VH3 (via conductor) are formed as third wiring layers on the second interlayer insulating layer 24. The external connection pads P2 may be arranged on each third via hole VH3 like an island, or may be connected to one end of the wiring which extends outward from the third via hole VH3.

The external connection pads P2 is electrodes to which an external connection terminal is connected respectively, and are shaped into a circle respectively, for example, when viewed from the top. A diameter of the external connection pad P2 is set to 350 to 550 μm, and an arrangement pitch of the external connection pads P2 is set to 600 to 900 μm. In this way, a relatively narrow pitch of the chip connection pad P1 is pitch-converted into a relatively wide pitch of the external connection pads P2 via the first and second wiring layers 30, 32 such that it responds to the connection portions of a mounting substrate (mother board, or the like).

With the above, a build-up wiring which is connected to the chip connection pads P1 via the first via holes VH1 (via conductors) and includes the external connection pads P2 (second connection pads) as the uppermost layer is formed on the first black insulating layer 20.

In the present embodiment, a three-layered (the first and second wiring layers 30, 32, and the external connection pads P2) build-up wiring is formed on the chip connection pad P1. In this case, the build-up wiring can be formed in any lamination number n (n is an integer of 1 or more).

Then, as depicted in FIG. 4B, a second black insulating layer 26 which covers the external connection pads P2 is formed on the second interlayer insulating layer 24. The second black insulating layer 26 is formed by the method similar to the above method of forming the first black insulating layer 20, and a gray color may be employed besides the black color.

Then, as depicted in FIG. 4C, a resist 28 such as a dry film resist, or the like, in which an opening portion 28a is provided over the external connection pads P2 respectively, is formed on the second black insulating layer 26.

Then, as depicted in FIG. 5A, the second black insulating layer 26 is ground and removed by the wet blasting method through the opening portions 28a in the resist 28, and thus connection holes CH (opening portions) each reaching the external connection pad P2 are formed in the second black insulating layer 26. The connection hole CH is formed as a circular opening portion when viewed from the top.

In the wet blasting method, the abrasive formed of alumina abrasive grains or silica abrasive grains is dispersed into a solvent such as a water, or the like, and then the grinding is performed by spraying the resultant solvent onto the target (black insulating layer) at a high pressure. For example, the abrasive formed of the alumina abrasive grains or the silica abrasive grains whose grain diameter is 5 to 20 μm is dispersed into a water at a concentration of about 14 vol %, and then the grinding is performed by spraying the water onto the target (black insulating layer) at a pressure of about 0.25 MPa.

Then, as depicted in FIG. 5B, the resist 28 is removed. Then, as the need arises, a contact layer (not shown) is formed on the external connection pads P2 in the connection holes CH by forming sequentially a Ni layer/an Au layer by means of the electroless plating, or the like. As the contact layer, a nickel (Ni) layer/a palladium (Pd) layer/a gold (Au) layer may be laminated from the bottom, or various laminated films which are formed by the plating may be employed.

Then, as depicted in FIG. 5C, the supporting body 5 is removed from a structure body in FIG. 5B by the wet etching. In case that the supporting body 5 is formed of copper, the copper etchant such as a copper (II) chloride aqueous solution, or the like is used.

The supporting body 5 is etched selectively with respect to the chip connection pads P1 (whose lower layer is the Au layer 10a) and the first black insulating layer 20, and is removed.

With the above, a wiring substrate 1 of the first embodiment is obtained. As depicted in FIG. 5C, in the wiring substrate 1 of the first embodiment, the chip connection pads P1 (first connection pads) are embedded in the lowermost chip connection pads P1, and outer surfaces of the chip connection pads P1 and an outer surface of the first black insulating layer 20 constitute the identical surface.

The first via hole VH1 is formed in the first black insulating layer 20 on the chip connection pads P1 respectively. The first wiring layers 30 each connected to the chip connection pad P1 via the first via hole VH1 (via conductor) are formed on the first black insulating layer 20.

The first interlayer insulating layer 22 in which the second via hole VH2 is provided on the connection part of the first wiring layers 30 is formed on the first wiring layers 30 and the first black insulating layer 20. The second wiring layers 32 each connected to the first wiring layer 30 via the second via hole VH2 (via conductor) are formed on the first interlayer insulating layer 22.

The second interlayer insulating layer 24 in which the third via hole VH3 is provided on the connection part of the second wiring layer is formed on the second wiring layers 32 and the first interlayer insulating layer 22. The external connection pads P2 (second connection pads) each connected to the second wiring layer 32 via the third via hole VH3 (via conductor) are formed on the second interlayer insulating layer 24.

Also, the second black insulating layer 26 in which the connection hole CH is provided on the external connection pads P2 respectively is formed on the second interlayer insulating layer 24.

The wiring substrate 1 of the first embodiment is the coreless wiring substrate which has no core substrate, and the three-layered build-up wiring (the first and second wiring layers 30, 32, and the external connection pads P2) is connected to the chip connection pad P1. The first black insulating layer 20 and the second black insulating layer 26 are formed as the solder resist in the outermost side of the both surface sides respectively.

The outer surfaces of the chip connection pads P1 constitute the identical surface with the outer surface of the first black insulating layer 20, and thus the chip connection pads P1 are exposed from the first black insulating layer 20. The side surfaces and the via connection surfaces of the chip connection pads P1 contact the first black insulating layer 20, and the outer surfaces (opposite surfaces to the via connection surfaces) are exposed from the first black insulating layer 20.

Otherwise, as described above, in the step in FIG. 2D, as depicted in lower view of FIG. 2D, in the case that a nickel (Ni) layer 10c (sacrifice layer)/a copper (Cu) layer 10d are formed as the chip connection pads P1, and the supporting body 5 is removed, and subsequently the nickel layer 10c (sacrifice layer) is removed.

In this case, as depicted in FIG. 5D, the outer surface of the chip connection pad P1 formed of the copper layer 10d is arranged in the position that is hollowed inside from the outer surface of the first black insulating layer 20. That is, the chip connection pad P1 formed of the copper layer 10d is exposed from a bottom part of a concave portion formed in the first black insulating layer 20.

In this case also, the side surfaces and the via connection surfaces of the chip connection pads P1 contact the first black insulating layer 20, and such a situation is obtained that the outer surfaces (opposite surfaces of the via connection surfaces) of the chip connection pads P1 are exposed from the first black insulating layer 20.

Also, the connection holes CH formed in the second black insulating layer 26 by the wet blasting method are arranged on the external connection pads P2. The peripheral part of the external connection pad P2 is covered with the second black insulating layer 26, and the center part of the external connection pad P2 is exposed from the connection hole CH.

Also, the first to third via holes VH1, VH2, VH3 formed in the first black insulating layer 20 and the first and second interlayer insulating layers 22, 24 respectively are opened toward the second black insulating layer 26 side. In addition to this, the bottom surfaces of the first to third via holes VH1, VH2, VH3 are constituted from the surfaces of the chip connection pad P1 and the first and second wiring layers 30, 32 respectively, and the first to third via holes VH1, VH2, VH3 are formed as the concave portion like a circular truncated cone whose opening area of the top end is larger than a bottom surface area. Then, the via conductor is formed (filled) in the first to third via holes VH1, VH2, VH3 respectively.

Here, the situation "the connection pads (the chip connection pads P1 and the external connection pads P2) are exposed from the black insulating layers 20, 26" means that respective surfaces of the connection pads are not covered with the black insulating layers 20, 26. Accordingly, the structure that the connection pads (the chip connection pads P1 and the external connection pads P2) are covered with the semiconductor chip or the external connection terminals is included in such situation.

Also, in the present embodiment, only the outermost insulating layer on both surface sides is set in a black color or a gray color. But the internal insulating layers (in FIG. 5C, the first and second interlayer insulating layers 22, 24) may also be formed of the black or gray insulating layer. That is, all the insulating layers of the wiring substrate may exhibit a black color or a gray color.

Next, a method of mounting a semiconductor chip on the wiring substrate 1 of the first embodiment will be explained hereunder.

As depicted in FIG. 6A, the wiring substrate 1 in FIG. 5C is reversed up and down, and such a situation is obtained the chip connection pads P1 is directed upward.

Then, as depicted in FIG. 6B, a solder 36 is coated on the chip connection pads P1 of the wiring substrate 1 respectively. Then, connection electrodes 40a of a semiconductor chip 40 are positioned on the solders 36 on the chip connection pads P1 of the wiring substrate 1, and the soldering is executed by applying the reflow heating at a temperature of 230 to 270° C.

Accordingly, as depicted in FIG. 6C, the semiconductor chip 40 is flip-chip connected to the chip connection pads P1 of the wiring substrate 1 by bump electrodes 42. Then, an underfill resin 44 is filled into a clearance located under the semiconductor chip 40. Accordingly, a semiconductor package is constructed.

In case that the BGA type semiconductor package is constructed, the solder ball is connected to the external connection pads P2 as the external connection terminal respectively before or after the semiconductor chip 40 is mounted. Also, in case that the PGA type semiconductor package is constructed, the connection pin is connected to the external connection pads P2 as the external connection terminal respectively before or after the semiconductor chip 40 is mounted. Alternatively, in case that the LGA type semiconductor package is constructed, the external connection pads P2 themselves are used as the external connection terminal.

Also, a chip capacitor may be mounted on the wiring substrate 1 before the semiconductor chip 40 is mounted. In this case, when the chip connection pads P1 or the external connection pad P2 is formed on the wiring substrate 1, capacitor connection pads for mounting the chip capacitor, which is made of the identical layer with these connection pads, is formed.

The inventor of this application executed the visual inspection so as to check whether or not the discoloration is caused in the insulating layer in gray to black colors by actually applying the heating process at a temperature of about 260° C. According to that result, the color of the insulating layer in gray to black colors was hardly changed even after the heating process was repeated ten times. In this manner, the insulating layer in gray to black colors has such characteristics that the discoloration is hard to occur even though such insulating layer is oxidized by the heating process.

Therefore, in above FIGS. 6B and 6C, even though the wiring substrate 1 is heated in the step of flip-chip connecting the semiconductor chip 40 to the wiring substrate 1, the color of the first and second black insulating layers 20, 26 formed on both surface sides is still kept in black color, and is hardly discolored. Also, even when the underfill resin 44 is cured by the heating, the discoloration is not caused in the first and second black insulating layers 20, 26.

As a result, such a drawback can be overcome that after the semiconductor chip 40 is mounted, the hue of the wiring substrate 1 is changed, whereby the appearance becomes worse. In addition, it can be appreciated that, even when the step which involves the heating process should be further performed after the semiconductor chip 40 is mounted, the color of the first and second black insulating layers 20, 26 is hardly changed.

Also, there are many cases where the assembling step (the step of fitting a reinforcing plate or a radiating plate) that needs an alignment should be performed after the semiconductor chip 40 is mounted. The alignment is performed based on the image recognition of alignment marks formed in the wiring substrate 1. In some cases the alignment mark is different in size from the connection hole CH, but this alignment mark has the identical structure with the connection hole CH.

At this time, unlike the present embodiment, in the case that the solder resist is discolored into brown color, the contrast of image becomes worse and in some cases it is difficult to perform the alignment.

In the present embodiment, because the black insulating layer is used as the solder resist, a light reflectance is different largely between the connection pads (the gold pads or the copper pads) and the black insulating layer. Therefore, the contrast of image of the alignment mark is improved excellently, and the alignment can be performed stably. Accordingly, the assembling steps such as the step of fitting a reinforcing plate or a radiating plate, etc. can be performed stably.

Also, in the above step of manufacturing the wiring substrate 1, the heating process is performed every time when the first and second black insulating layers 20, 26 and the first and second interlayer insulating layers 22, 24 are laminated respectively. Further, also in the step of forming the first and second wiring layers 30, 32, the heating process is performed at the time of forming the resist. As a result, the heating process is applied particularly plural times to the first black insulating layer 20, but no discoloration is caused in the first black insulating layer 20.

Also, when the semiconductor chip 40 is mounted onto the chip connection pads P1 or when the external connection terminals such as the solder balls, or the like are joined to the external connection pads P2, the alignment is performed by the image recognition. At this time, the contrast between the connection pads (the chip connection pads P1 and the external connection pad P2) and the first and second black insulating layers 20, 26 is improved excellently, and therefore the alignment can be performed stably with high precision.

Moreover, also when a surface condition such as a surface damage of the connection pads (the chip connection pads P1 and the external connection pad P2), adhesion of contaminants, or the like is inspected, the contrast between the connection pads (the chip connection pads P1 and the external connection pad P2) and the first and second black insulating layers 20, 26 is improved excellently, and therefore the inspection can be performed stably with high precision.

Next, the step of grinding the second black insulating layer 26 by the wet blasting method to form the connection holes CH (the step described above in FIG. 5A) will be explained in more detail hereunder.

As the method of forming the connection holes (opening portions) in the solder resist, generally there are the method of patterning the photosensitive solder resist by the photolithography, the method of processing the non-photosensitive solder resist by the laser, or the like.

As described above, the second black insulating layer 26 has the characteristic that can absorb easily a light. Therefore, in many cases it is difficult to form the hole pattern with high precision by the photolithography when the black insulating layer is formed of a photosensitive resin.

Figure 7A:
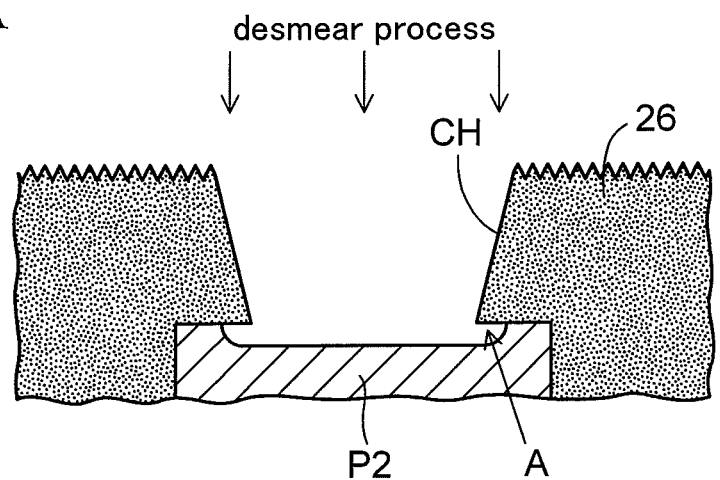
FIGS. 7A and 7B are sectional views explaining superiority of the wet blasting method applied when a connection hole is formed in the method of manufacturing the wiring substrate according to the first embodiment.

Also, as depicted in FIG. 7A, in case that the connection hole CH is formed by processing the second black insulating layer 26 by means of the laser, a resin smear is produced in the connection hole CH after the laser processing. Therefore, it is necessary to remove the resin smear by the desmear process such as the permanganic acid process, or the like.

At this time, the external connection pad P2 (copper) on the bottom part of the connection hole CH is etched isotropically by the desmear process. Therefore, a cut-in portion A is produced under the second black insulating layer 26 in vicinity of the connection hole CH.

As a result, when the contact layer (Ni/Au layer, or the like) is formed on the external connection pad P2 by the electroless plating, a void is easily generated in the cut-in portion A. For this reason, it is feared that, in providing the external connection terminal on the external connection pads P2, reliability of the electrical connection becomes a problem.

In addition, the surface of the second black insulating layer 26 is etched by the desmear process, and unevenness is formed on the surface (surface roughness (Ra): almost 500 nm). If unevenness is formed on the surface of the second black insulating layer 26, a selective growth of the plating is spoiled when the contact layer (the Ni/Au layer, or the like) is formed on the external connection pad P2 by the electroless plating. Hence, sometimes the plating is also deposited on the second black insulating layer 26.

Figure 7B:
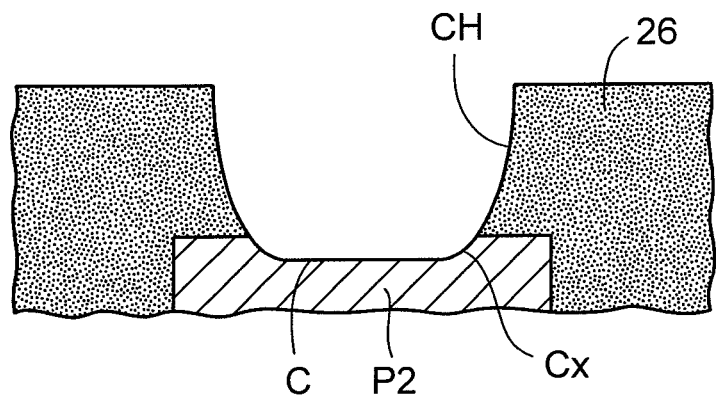

On the contrary, as depicted in FIG. 7B, when the connection hole CH is formed in the second black insulating layer 26 by the wet blasting method, after the grinding of the second black insulating layer 26 is finished, the external connection pad P2 (copper) is removed in depth by about 0.4 to 5 μm and a minute concave portion C is provided. The side wall surface of the connection hole CH and a side surface Cx of the concave portion C of the external connection pad P2 are formed not to constitute a discontinuous surface at their boundary part, but to constitute a continuous identical surface. In this way, the concave portion C communicated with the connection hole CH is formed.

The connection hole CH is formed to have a curved side wall surface that is protruded or curved in the outer peripheral side direction of the external connection pad P2 (second connection pad), and an area of the opening portion which is opened to the outer surface of the second black insulating layer 26 is formed larger than an area of the bottom surface. The curved surface which is a continuous identical surface is constructed by the curved side wall surface of the connection hole CH and the curved side surface Cx of the concave portion C of the external connection pad P2.

Also, a sectional shape of the side wall surface of the connection hole CH is formed like a circular arc that protrudes to the outer periphery direction of the external connection pad P2.

Then, only by performing a water rinse after the second black insulating layer 26 is removed by the wet blasting method, the surface of the external connection pad P2 can be exposed in a clean state.

That is, it is not needed to perform the desmear process by employing the wet blasting method. As a result, there is no fear that the cut-in portion A of the external connection pad P2 is produced in the bottom part of the connection hole CH.

Also, because the desmear process is omitted, unevenness is not formed on the surface of the second black insulating layer 26 and also a smooth condition (surface roughness (Ra): 10 to less then 150 nm) is maintained. Therefore, when the contact layer (Ni/Au layer, or the like) is formed on the external connection pad P2 by the electroless plating, there is no fear that a selective growth of the plating is spoiled.

Also, the side wall surface of the connection hole CH formed by the wet blasting method has a surface roughness (Ra) of 150 to 500 nm, and is adequately roughened. Therefore, the wet blasting method also possesses such as advantage that the solder is formed with high adhesion when the solder joint is performed.

In this manner, by employing the wet blasting method, not only the inner surface of the connection hole CH can be formed as the continuous surface, but also because the desmear process can be omitted, there is no fear that the cut-in portion A is produced on the external connection pad P2 and also unnecessary unevenness is formed on the surface of the second black insulating layer 26. Accordingly, the contact layer (Ni/Au layer, or the like) is formed on the external connection pad P2 by the electroless plating with high reliability.

Figure 8:
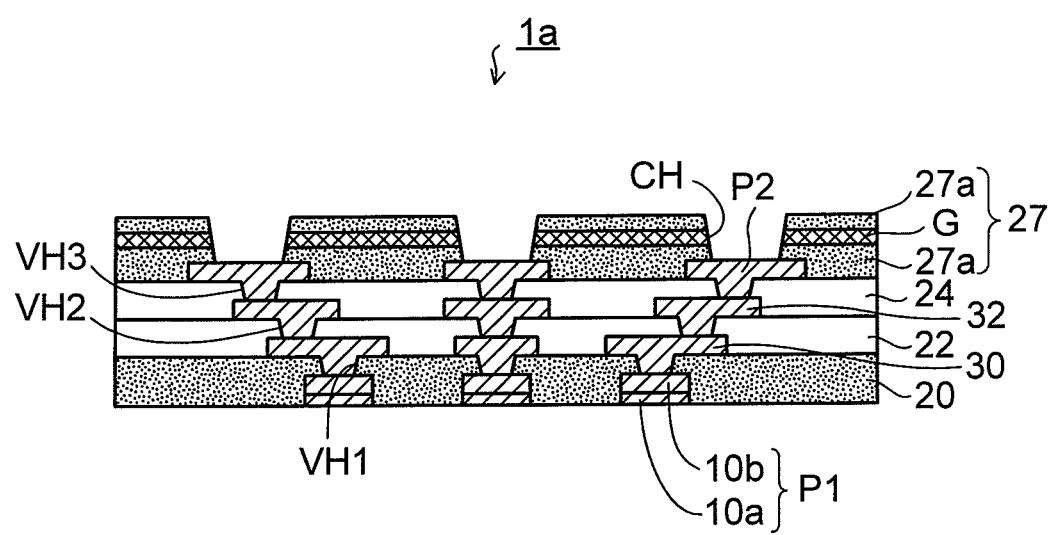
FIG. 8 is a sectional view depicting a wiring substrate according to a variation of the first embodiment.

In FIG. 8, a wiring substrate 1a according to a variation of the first embodiment is depicted. As depicted in FIG. 8, in the wiring substrate 1a according to the variation, instead of the second black insulating layer 26 in the above wiring substrate 1 in FIG. 5C, a glass-cloth containing black insulating layer 27 in which a glass cloth G is formed in a middle part of a black resin 27a in the thickness direction is employed.

In forming the glass-cloth containing black insulating layer 27, a prepreg may be constructed by the glass cloth G impregnated with the black resin 27a, then the prepreg may be pasted on the external connection pads P2, and then the black resin 27a may be cured by the heating process.

By employing the glass-cloth containing black insulating layer 27, rigidity of the wiring substrate 1a which has no core substrate can be enhanced and also occurrence of a warp of the wiring substrate 1a can be prevented.

In FIG. 8, the manufacturing steps of the wiring substrate 1a are similar to those of the wiring substrate 1 in FIG. 5C, except that the glass-cloth containing black insulating layer 27 is employed instead of the second black insulating layer 26.

Even when the glass-cloth containing black insulating layer 27 is employed, the wet blasting method is suitable in forming the connection hole CH.

Figure 9A:
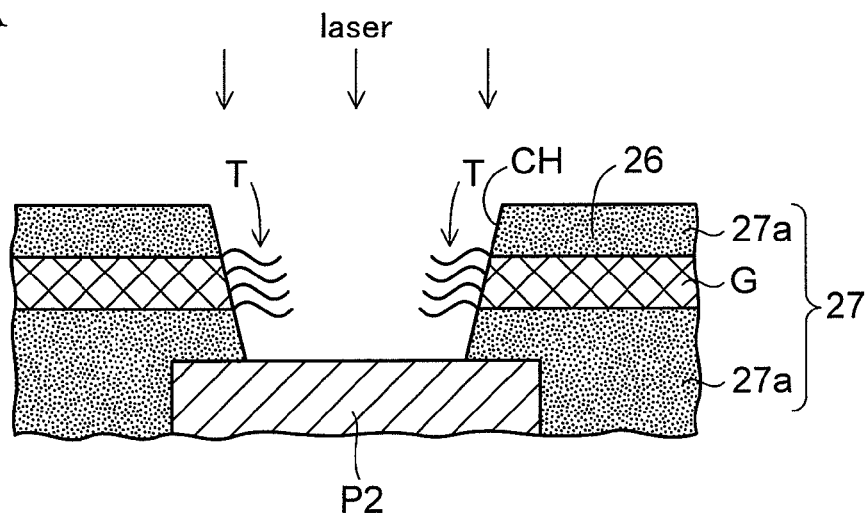
FIGS. 9A and 9B are sectional views explaining superiority of the wet blasting method applied when a connection hole is formed in a method of manufacturing a wiring substrate according to a variation of the first embodiment.

In FIG. 9A, such a state is depicted that the connection hole CH is formed by processing the glass-cloth containing black insulating layer 27 by means of the laser. In this case, owing to a difference in workability between the black resin 27a and the glass cloth G by the laser, a projection portion T of the glass cloth G is formed inwardly from the side wall surface of the connection hole CH. Also, the projection portion T of the glass cloth G becomes conspicuous by performing the desmear process.

In the case that the glass cloth G is projected from the side wall surface of the connection hole CH, when the contact layer (Ni/Au layer, or the like) is formed on the external connection pad P2 by the electroless plating, a plating liquid is not sufficiently supplied up to the bottom part of the connection hole CH. Thereby the plating is not satisfactorily applied to the lower side of the projection portion T of the glass cloth G. Also, such a problem exists that it becomes difficult to fit the solder ball or the pin terminal as the external connection terminal onto the external connection pad P2.

Figure 9B:
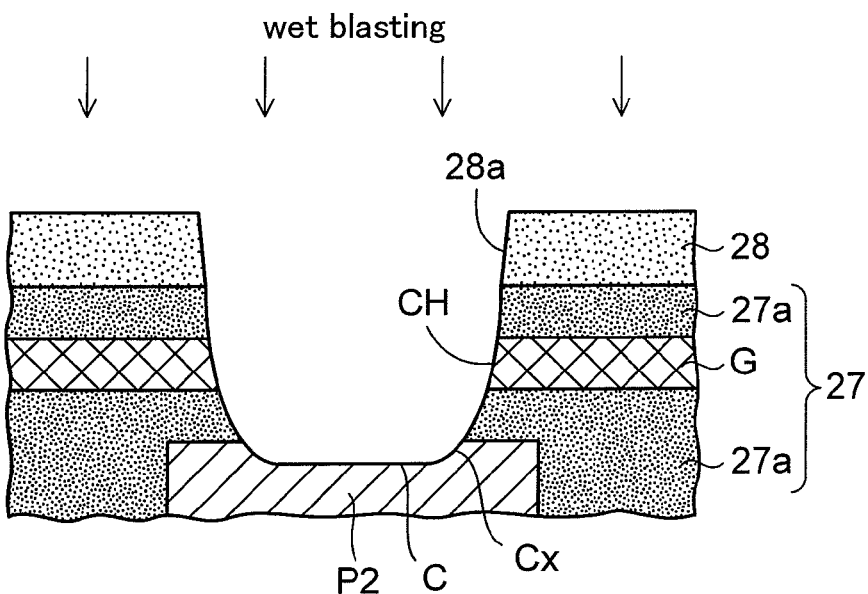

However, as depicted in FIG. 9B, in the present embodiment, by employing the wet blasting method, the glass cloth G and the black resin 27a can be processed equally by the grinding. Therefore, the ground surface of the glass cloth G and the ground surface of the black resin 27a can constitute the identical surface, and there is no fear that the projection portion T of the glass cloth G is formed in the connection hole CH.

Therefore, even when the glass-cloth containing black insulating layer 27 is employed, the normal connection hole CH can be formed easily. As a result, the contact layer (Ni/Au layer, or the like) can be formed on the external connection pad P2 by the electroless plating with high reliability.

Next, in the wiring substrates 1, 1a in the above present embodiment, how to form a structure that is advantageous in transferring the solder ball or the lead pin acting as the external connection terminal into the connection hole CH by using a transferring jig will be explained hereunder.

Figure 10A:
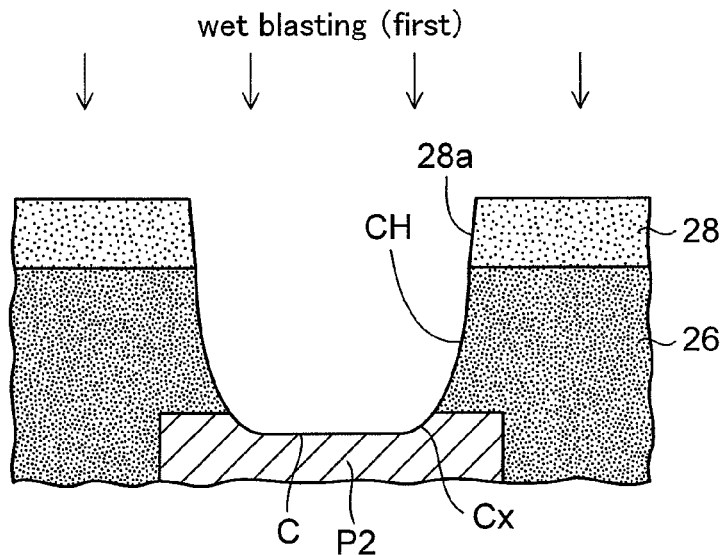
FIGS. 10A to 10C are sectional views (#1) depicting processes for obtaining a connection hole which makes the transfer of the solder ball easy, in the method of manufacturing the wiring substrate according to the first embodiment.
Figure 10B:
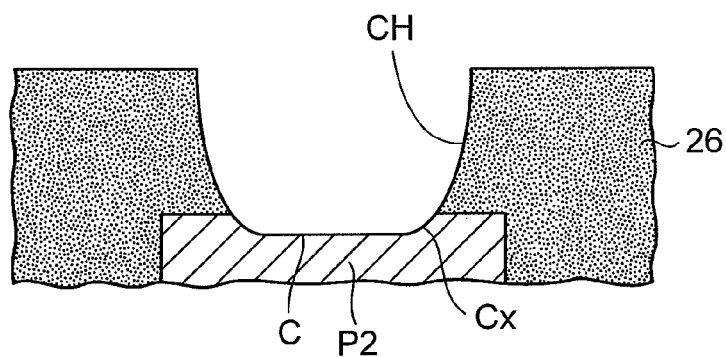

As depicted in FIG. 10A, as explained as above in FIG. 5A, the second black insulating layer 26 is ground through the opening portion 28a of the resist 28 by the wet blasting method, and thus the connection hole CH reaching the external connection pad P2 is formed (first-time wet blasting method). Then, as depicted in FIG. 10B, the resist is removed.

Figure 10C:
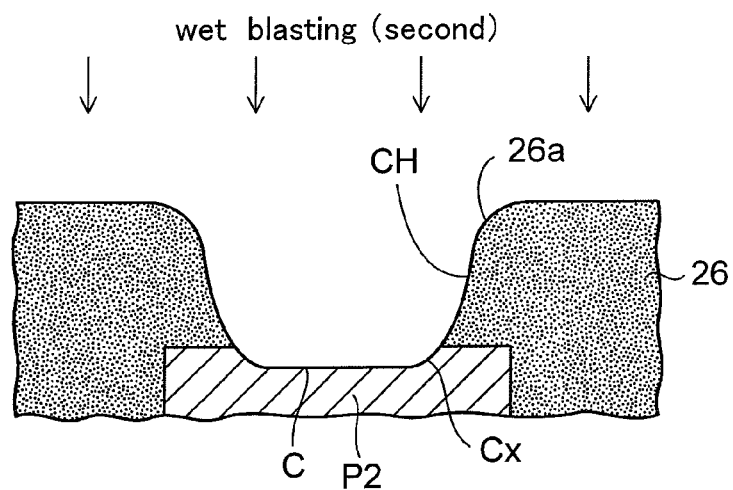

Then, as depicted in FIG. 10C, the surface of the second black insulating layer 26 and the inside of the connection hole CH are ground by the wet blasting method (second-time wet blasting method). At this time, the conditions are set such that the surface of the second black insulating layer 26 is removed by about 0.5 to 4 μm.

Accordingly, a corner part of an upper end of the connection hole CH is processed like a rounded shape, and a chamfered portion 26a (also called an R surface) is formed.

Figure 11A:
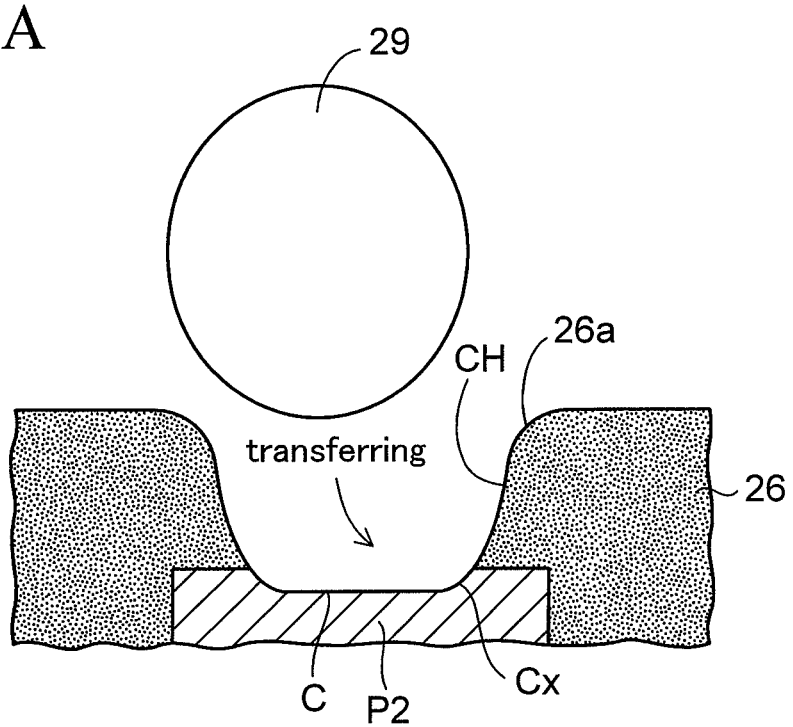
FIGS. 11A and 11B are sectional views (#2) depicting processes for obtaining a connection hole which makes the transfer of the solder ball easy, in the method of manufacturing the wiring substrate according to the first embodiment.
Figure 11B:
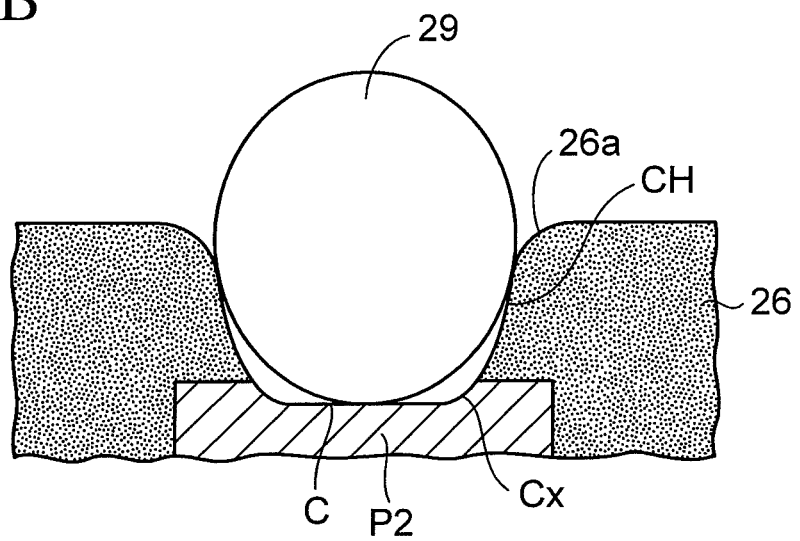

As depicted in FIGS. 11A and 11B, the corner part of the upper end of the connection hole CH is shaped into the chamfered portion 26a, thereby when the solder ball 29 is transferred into the connection hole CH from a transferring jig (not shown), a solder ball 29 can be easily transferred into the connection hole CH even though a misalignment is caused slightly. Also, the transferring can be easily done in transferring and fitting the lead pin into the connection hole CH.

Second Embodiment

Figure 12A:
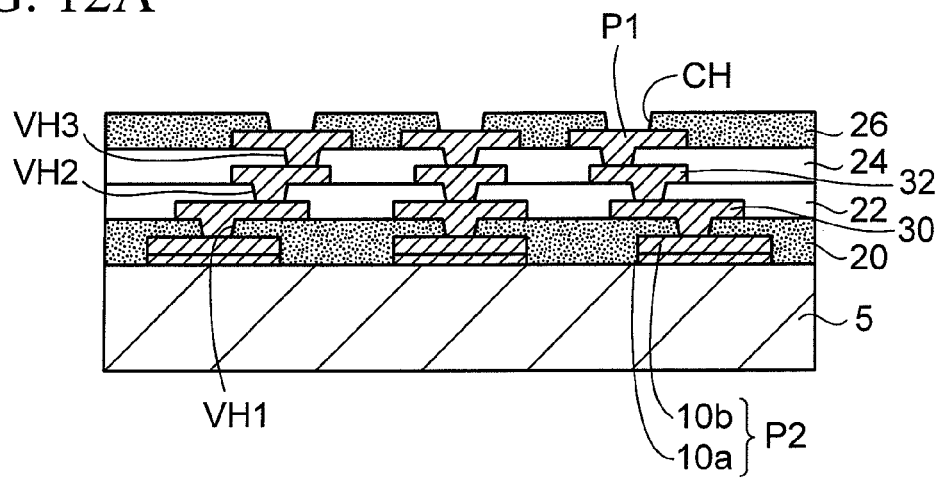
FIGS. 12A to 12C are sectional views depicting a method of manufacturing a wiring substrate according to a second embodiment.
Figure 12B:
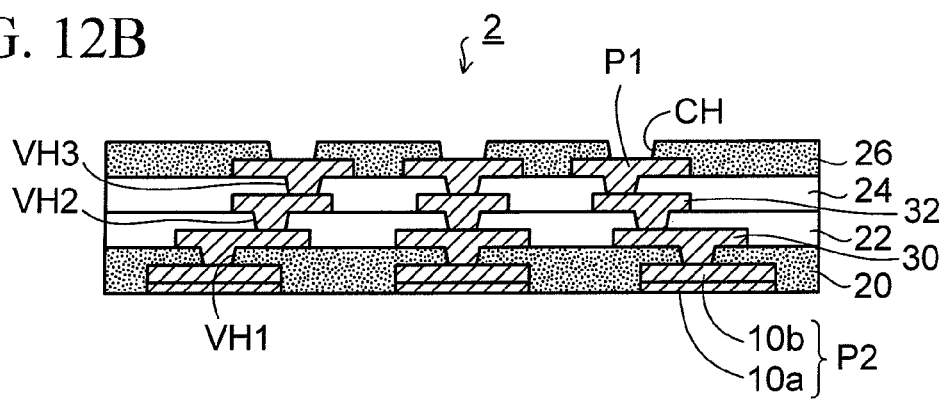

FIGS. 12A and 12B are sectional views depicting a method of manufacturing a wiring substrate according to a second embodiment.

In the above first embodiment, first, the chip connection pads P1 whose pitch is narrow are formed on the supporting body 5, and then the external connection pads P2 whose pitch is wide are formed thereon via the build-up wiring. In the second embodiment, conversely, first, the external connection pads P2 whose pitch is wide are formed on the supporting body 5, and then the chip connection pads P1 whose pitch is narrow are formed thereon via the build-up wiring.

In the second embodiment, as depicted in FIG. 12A, first, the Au layer 10a/the Ni layer 10b are formed on the supporting body 5 sequentially from the bottom by the similar the method to that of the first embodiment, and thus the external connection pads P2 (first connection pads) are obtained.

Then, the first black insulating layer 20 is formed on the external connection pads P2 and the supporting body 5. Then, the first via holes VH1 each reaching the external connection pad P2 are formed in the first black insulating layer 20.

Then, like the first embodiment, the first wiring layers 30 each connected to the external connection pad P2 via the first via hole VH1 (via conductor) are formed on the first black insulating layer 20.

Also, like the first embodiment, the second wiring layers 32 each connected to the first wiring layer 30 via the second via hole VH2 in the first interlayer insulating layer 22 are formed on the first interlayer insulating layer 22. Then, like the first embodiment, the chip connection pads P1 (second connection pads) each connected to the second wiring layer 32 via the third via hole VH3 in the second interlayer insulating layer 24 are formed as the third wiring layers on the second interlayer insulating layer 24.

Then, by the similar method to the first embodiment, the second black insulating layer 26 which covers the chip connection pads P1 is formed, and then the second black insulating layer 26 is removed through the opening portions of the resist by the wet blasting method. Accordingly, the connection holes CH each reaching the chip connection pad P1 can be obtained.

Then, as depicted in FIG. 12B, like the first embodiment, the supporting body 5 is removed by the wet etching.

As a result, a wiring substrate 2 of the second embodiment is obtained. In the wiring substrate 2 of the second embodiment, a relatively wide pitch of the external connection pads P2 corresponding to the connection parts of the mounting substrate (mother board, or the like), is pitch-converted into a relatively narrow pitch of the chip connection pads P1 via the first and second wiring layers 30, 32.

In the wiring substrate 2 of the second embodiment, the external connection pads P2 (first connection pads) are embedded in the first black insulating layer 20 located in the lowermost, and then the outer surface of the first black insulating layer 20 and the outer surfaces of the external connection pads P2 constitute the identical surface. Thus, the external connection pads P2 are exposed from the first black insulating layer 20.

The side surfaces and the via connection surfaces of the external connection pads P2 contact the first black insulating layer 20, and the outer surfaces (opposite surfaces to the via connection surfaces) are exposed from the first black insulating layer 20.

Also, the first to third via holes VH1, VH2, VH3 formed in the first black insulating layer 20 and the first and second interlayer insulating layers 22, 24 respectively are opened toward the second black insulating layer 26 side. In addition to this, bottom surfaces of the first to third via holes VH1, VH2, VH3 are constructed by the surfaces of the external connection pads P2 and the first and second wiring layers 30, 32 respectively. Then, the first to third via holes VH1, VH2, VH3 are formed as the concave portion like a circular truncated cone whose opening area of the top end is larger than the bottom surface area. Also, the via conductor is formed (filled) in the first to third via holes VH1, VH2, VH3 respectively.

Also, the connection holes CH in the second black insulating layer 26 by the wet blasting method are arranged on the chip connection pads P1 (second connection pads). The peripheral part of the chip connection pads P1 is covered with the second black insulating layer 26, and the center part of the chip connection pads P1 is exposed from the connection hole CH.

Also in the second embodiment, the connection hole CH arranged on the chip connection pad P1 (second connection pad) is formed similarly to the shape explained in FIG. 7B in the first embodiment.

Figure 12C:
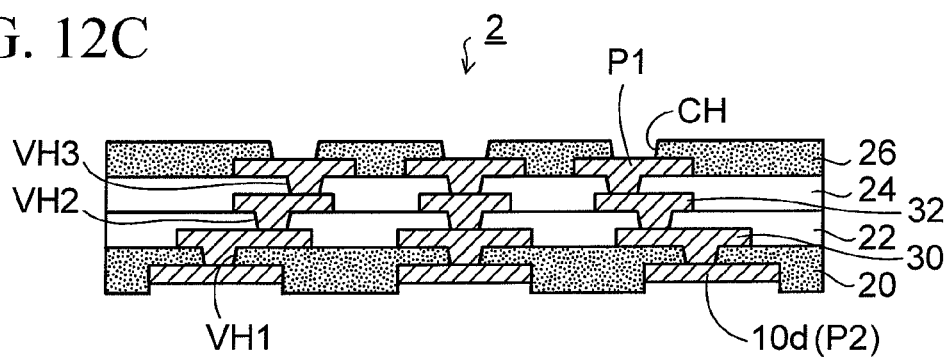

Also, in FIG. 12A, as the external connection pad P2, a nickel (Ni) layer (sacrifice layer)/a copper (Cu) layer may be formed on the supporting body 5 sequentially from the bottom. In the case, the supporting body 5 is removed, and subsequently the nickel layer (sacrifice layer) is removed. Thus, As depicted in FIG. 12C, the external connection pad P2 is formed of the copper layer 10d only, the external connection pad P2 formed of the copper layer 10d is exposed from a bottom part of a concave portion in the first black insulating layer 20.

Figure 13:
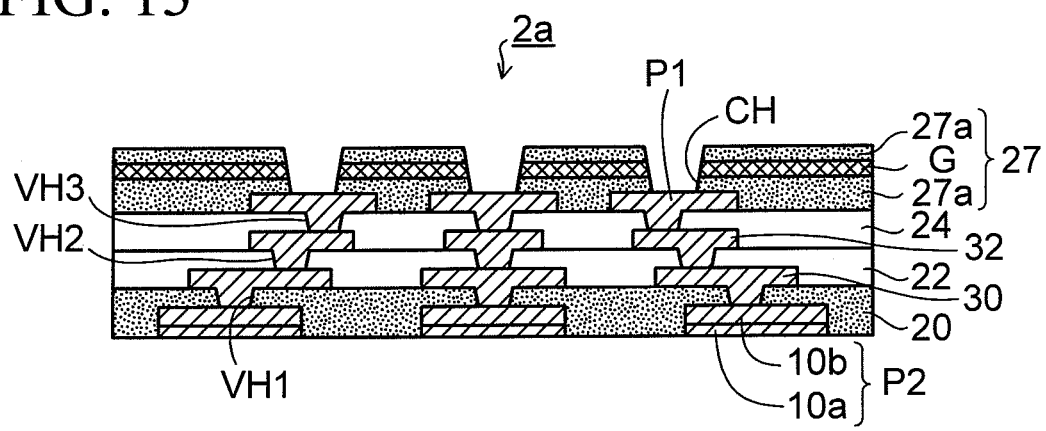
FIG. 13 is a sectional view depicting a wiring substrate according to a variation of the second embodiment.

In FIG. 13, a wiring substrate 2a according to a variation of the second embodiment is depicted. As depicted in FIG. 13, like the wiring substrate 1a according to the above variation of the first embodiment (FIG. 8), the glass-cloth containing black insulating layer 27 in which the glass cloth G is formed in the middle part of the black resin 27a, may be employed, instead of the second black insulating layer 26 in the wiring substrate 2 in FIG. 12B.

Figure 14:
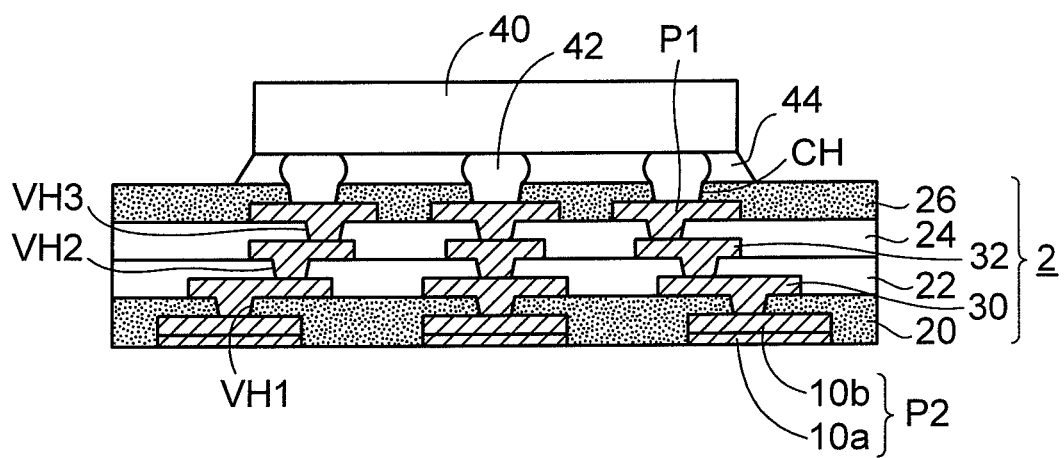
FIG. 14 is a sectional view depicting a state that a semiconductor chip is mounted on the wiring substrate according to the second embodiment.

Then, as depicted in FIG. 14, the semiconductor chip 40 is flip-chip connected to the chip connection pads P1 of the wiring substrate 2 in FIG. 12B via the bump electrodes 42, and then the underfill resin 44 is filled into a clearance located under the semiconductor chip 40. Accordingly, a semiconductor package is constructed.

Also in the second embodiment, like the first embodiment, the discoloration of the first and second black insulating layers 20, 26 is hardly caused when the heating process is applied to the wiring substrate 2. Accordingly, such a drawback can be overcome that its appearance becomes worse, and the alignment based on the image recognition in the later assembling step can be performed stably.

Next, the superiority achieved when the wiring substrates 1, 2 of the first and second embodiments (FIG. 6A, FIG. 12B) are employed as the wiring substrate on which a chip capacitor is mounted will be explained hereunder. In case that the wiring substrate 1 of the first embodiment (FIG. 6A) is employed, the chip capacitor is connected to capacitor connection pads P2C which are formed from the identical layer with the external connection pads P2.

Also, in case that the wiring substrate 2 of the second embodiment (FIG. 12B) is employed, the chip capacitor is connected to capacitor connection pads P1C which are formed from the identical layer with the chip connection pads P1.

Figure 15A:
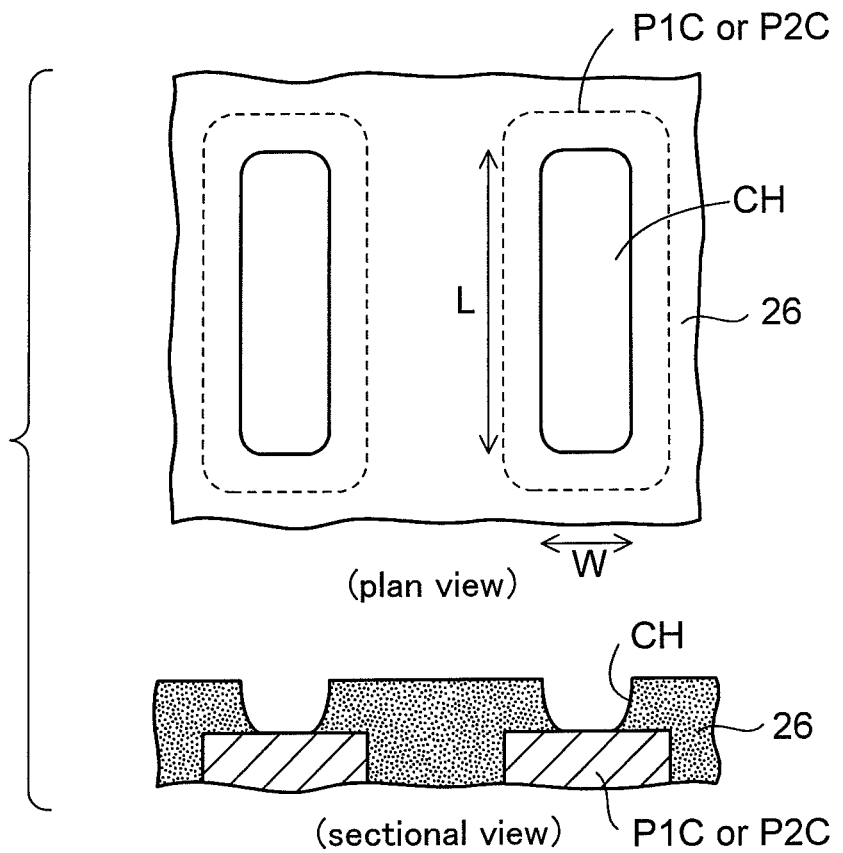
FIGS. 15A and 15B are a plan view and sectional views depicting a state that a chip capacitor is mounted on the wiring substrate according to the second embodiment.

As depicted in a plan view and a sectional view of FIG. 15A, in the wiring substrate for mounting the chip capacitor, a pair of rectangular capacitor connection pads P1C or P2C are employed so as to correspond to the chip capacitor which has the connection electrode on both ends, and the connection hole CH provided in the second black insulating layer 26 is opened like a rectangular shape on the capacitor connection pads P1C or P2C respectively. For example, a length L of the rectangular connection hole CH is about 1.4 mm, and a width W is 0.65 mm, and thus the connection hole CH whose area is relatively large is needed.

Figure 15B:
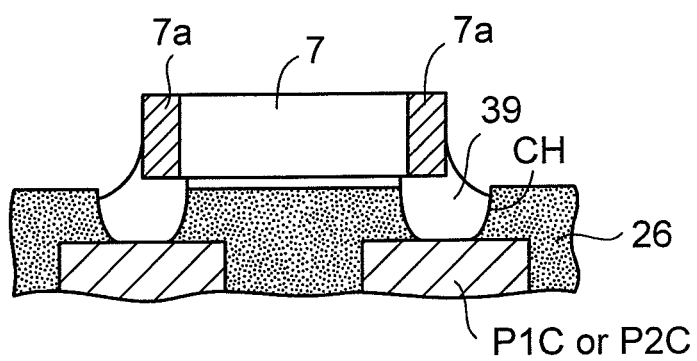

Then, as depicted in FIG. 15B, for example, a chip capacitor 7 which includes a rectangular parallelepiped capacitor main body made of ceramics and connection electrodes 7a which is provides on the opposing side surfaces in the capacitor main body, is prepared. Then, the chip capacitor 7 is arranged on wiring substrate such that the connection electrodes 7a on both ends are arranged on a pair of connection holes CH, and the connection electrodes 7a of the chip capacitor 7 are connected to the capacitor connection pads P1C or P2C via a solder 39.

Unlike the present embodiment, in case that the rectangular connection hole CH is formed by processing the second black insulating layer 26 by means of the laser, because the light flux of laser has a circular shape, the laser shot is required at least several times when the one rectangular connection hole CH is formed. Therefore, a processing time becomes considerably long and also a production efficiency is lowered, and thus such a problem exists that an increase in cost is brought about.

However, the wet blasting method used in the present embodiment can remove collectively the second black insulating layer 26 to scarcely depend on a size of the grinding area. Therefore, even though the rectangular connection hole CH that the grinding area is relatively large is formed, the connection hole CH can be formed easily without an increase of a process time.

Third Embodiment

FIGS. 16A to 16D and FIG. 17 are sectional views depicting a method of manufacturing a wiring substrate according to a third embodiment.

The wiring substrate according to the third embodiment includes a core substrate, the build-up wiring is formed on both surface sides of the core substrate, and a black insulating layer is formed as the solder resist to the outermost of both surface sides respectively.

Figure 16A:
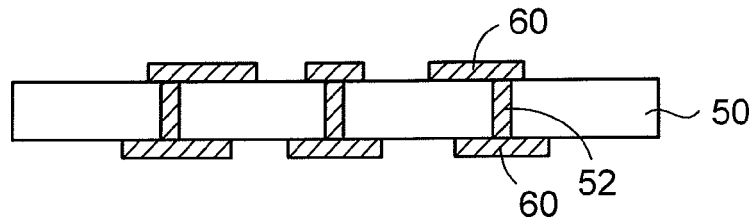
FIGS. 16A to 16D are sectional views depicting a method of manufacturing a wiring substrate according to a third embodiment.

In the third embodiment, as depicted in FIG. 16A, first, a core substrate 50 in which a first wiring layer 60 is formed on both surface sides respectively is prepared. Penetration electrodes 52 which penetrate in the thickness direction are provided in the core substrate 50, and the first wiring layers 60 on both surface sides are connected mutually via the penetration electrode 52. The core substrate 50 is formed of an insulating substrate made of a glass epoxy resin, or the like.

Figure 16B:
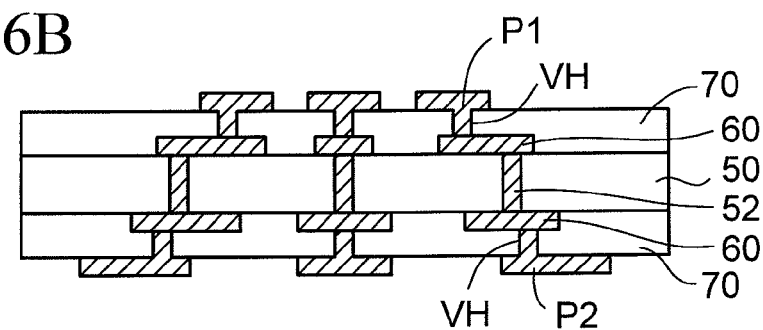

Then, as depicted in FIG. 16B, an interlayer insulating layer 70 is formed on both surface sides of the core substrate 50 respectively, and then via holes VH each reaching the first wiring layers 60 are formed in the interlayer insulating layer 70 respectively. Then, the external connection pads P2 (first connection pads) each connected to the first wiring layer 60 via the via hole VH (via conductor) are formed as the second wiring layers on the interlayer insulating layer 70 located on the lower surface side of the core substrate 50.

Also, the chip connection pads P1 (second connection pads) each connected to the first wiring layer 60 via the via hole VH (via conductor) are formed as the second wiring layers on the interlayer insulating layer 70 located on the upper surface side of the core substrate 50.

The external connection pad P2 and the chip connection pad P1 may be arranged on each via hole VH like an island, or may be connected to one end of the wiring which extends outwardly from the via hole VH.

Figure 16C:
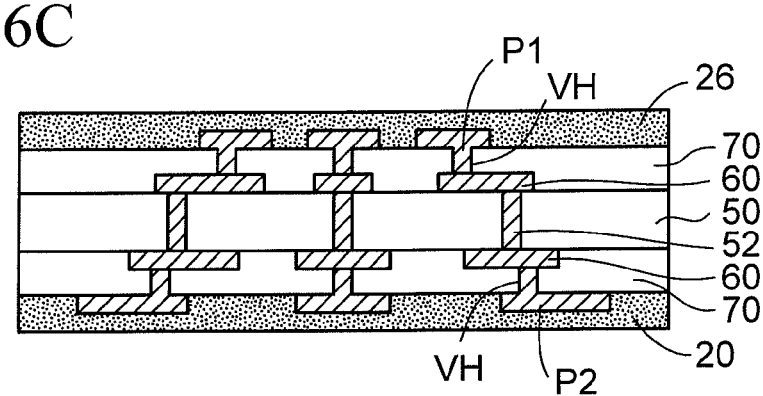

Then, as depicted in FIG. 16C, the first black insulating layer 20 which covers the external connection pads P2 is formed on the lower surface side of the core substrate 50. Also, the second black insulating layer 26 which covers the chip connection pads P1 is formed on the upper surface side of the core substrate 50.

Figure 16D:
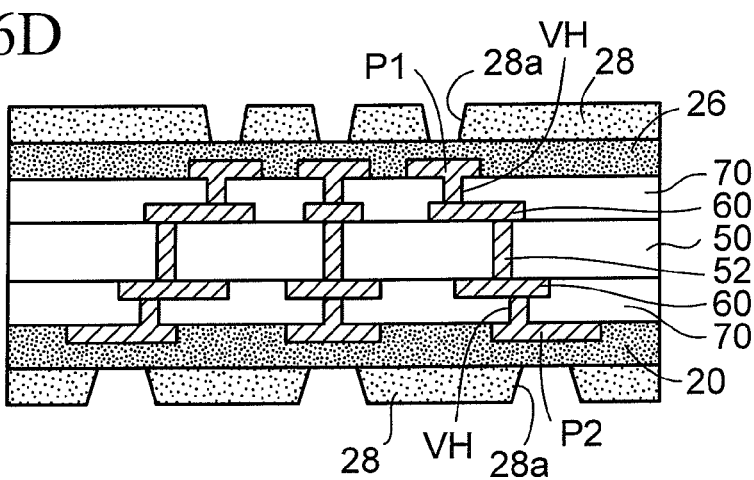

Then, as depicted in FIG. 16D, the resist 28 such as the dry film resist, or the like, in which the opening portion 28a is provided on the chip connection pads P1 respectively, is formed on the upper surface side of the core substrate 50. Similarly, the resist 28 in which the opening portion 28a is provided on the external connection pads P2 respectively is formed on the lower surface side of the core substrate 50.

Figure 17:
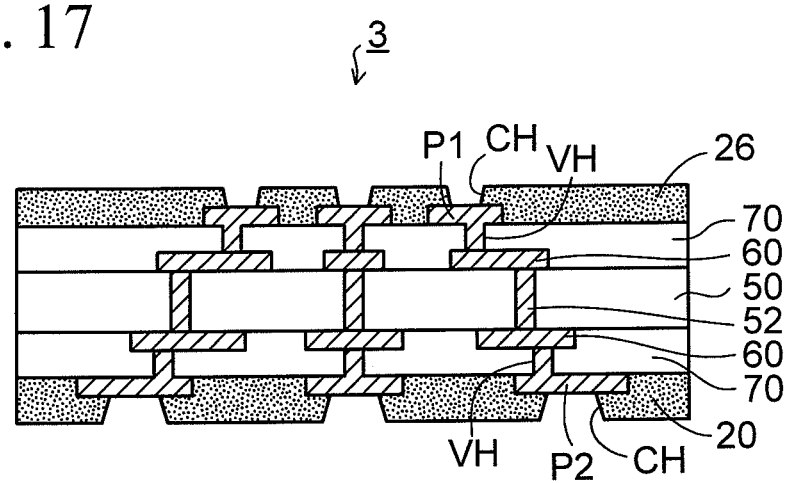
FIG. 17 is a sectional view depicting a wiring substrate according to the third embodiment.

Then, as depicted in FIG. 17, in both surface sides of the core substrate 50, the first and second black insulating layers 20, 26 are ground and removed through the opening portion 28a in the resist 28 by the wet blasting method respectively. Then, the resist 28 is removed.

Accordingly, the connection holes CH each reaching the external connection pad P2 (first connection pad) are formed in the first black insulating layer 20 on the lower surface side of the core substrate 50. Also, the connection holes CH each reaching the chip connection pad P1 (second connection pad) are formed in the second black insulating layer 26 on the upper surface side of the core substrate 50.

Then, as the need arises, the contact layer (not shown) is provided on the chip connection pads P1 and the external connection pads P2 by forming the Ni layer/the Au layer by means of the electroplating, or the like.

As a result, a wiring substrate 3 according to the third embodiment is obtained.

In the wiring substrate 3 of the third embodiment, a relatively wide pitch of the external connection pads P2 corresponding to the connection parts of the mounting substrate (mother board, or the like), is pitch-converted into a relatively narrow pitch of the chip connection pads P1 via the first wiring layer 60 formed on both surfaces of the core substrate 50.

In the example in FIG. 17, the two-layered wiring layer is formed on both surface sides of the core substrate 50. In this case, the number of laminated layers in the wiring layers can be set arbitrarily.

In the wiring substrate 3 of the third embodiment, the build-up wiring is formed on both surface sides of the core substrate 50. Therefore, the connection holes CH are formed in the black insulating layers 20, 26 on the connection pads (the chip connection pad P1 and the external connection pad P2) on both surface sides respectively, and thus the connection pads on both surface sides are exposed.

Also in the third embodiment, the connection holes CH arranged on the connection pads (the chip connection pad P1 and the external connection pad P2) respectively are formed similarly to the shape explained in FIG. 7B in the first embodiment.

Figure 18:
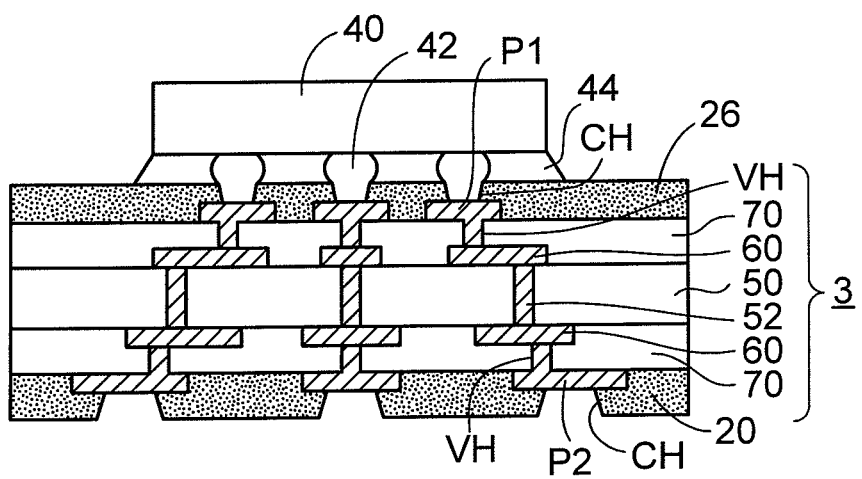
FIG. 18 is a sectional view depicting a state that a semiconductor chip is mounted on the wiring substrate according to the third embodiment.

Also, as depicted in FIG. 18, the semiconductor chip 40 is flip-chip connected to the chip connection pad P1 of the wiring substrate 3 in FIG. 17 via the bump electrodes 42, and then the underfill resin 44 is filled in a clearance located under the semiconductor chip 40. As a result, the semiconductor package is constructed.

Also in the third embodiment, like the first embodiment, the discoloration of the first and second black insulating layers 20, 26 is hardly caused when the heating process is applied to the wiring substrate 3. Accordingly, such a drawback can be overcome that its appearance becomes worse, and the alignment based on the image recognition in the later assembling step can be performed stably.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. A wiring substrate, comprising:
   a first insulating layer constituting a surface of the wiring substrate, and exhibiting a black color or a gray color;
   a first connection pad formed to be exposed from the surface of the wiring substrate, and buried in the first insulating layer, and the first connection pad having a side face and back face covered with the first insulating layer;
   a second insulating layer constituting a reverse surface of the wiring substrate, and exhibiting a black color or a gray color;
   a second connection pad formed to be exposed from the reverse surface of the wiring substrate, and buried in the second insulating layer, and the second connection pad having a side face and back face covered with the second insulating layer; and
   a connection hole formed in the second insulating layer, and exposing the face of the second connection pad, located to the reverse surface side of the wiring substrate,
   wherein the connection hole has a side wall surface formed like a curved surface, and has a shape in which an area of the opening portion which is opened to the outer surface of the second insulating layer is formed larger than an area of the bottom surface of the connection hole.

2. A wiring substrate according to claim 1, wherein the wiring substrate has no core substrate, and an outer surface of the first connection pad is exposed from an outer surface of the first insulating layer, and a side surface and an opposite surface of the outer surface of the first connection pad contact the first insulating layer.

3. A wiring substrate according to claim 2, wherein the second insulating layer includes a glass cloth.

4. A wiring substrate according to claim 1, wherein one of the first connection pad and the second connection pad is a chip connection pad for flip-chip connecting a semiconductor chip, and another is an external connection pad for connecting an external connection terminal, and an arrangement pitch of the chip connection pad is narrower than an alignment pitch of the external connection pad.

5. A wiring substrate according to claim 1, wherein the second insulating layer is formed of a glass cloth impregnated with a black resin.

6. A wiring substrate comprising:
   a first insulating layer formed as an outermost layer on one surface side, and exhibiting a black color or a gray color;
   a first connection pad formed to be exposed from the first insulating layer;
   a second insulating layer formed as an outermost layer on another surface side, and exhibiting a black color or a gray color; and
   a second connection pad formed to be exposed from the second insulating layer;
   wherein a connection hole having a side wall surface formed like a curved surface is formed in the second insulating layer, and the second connection pad is exposed to a bottom part of the connection hole; and
   wherein a concave portion is provided in the second connection pad on the bottom part of the connection hole, and the side wall surface of the connection hole and a side surface of the concave portion of the second connection pad constitute a continuous identical surface.

7. A wiring substrate according to claim 6, wherein the wiring substrate has no core substrate, and an outer surface of the first connection pad is exposed from an outer surface of the first insulating layer, and a side surface and an opposite surface of the outer surface of the first connection pad contact the first insulating layer.

8. A wiring substrate according to claim 7, wherein the second insulating layer includes a glass cloth.

9. A wiring substrate according to claim 6, wherein one of the first connection pad and the second connection pad is a chip connection pad for flip-chip connecting a semiconductor chip, and another is an external connection pad for connecting an external connection terminal, and an arrangement pitch of the chip connection pad is narrower than an alignment pitch of the external connection pad.

10. A wiring substrate according to claim 6, wherein the second insulating layer is formed of the glass cloth impregnated with the black resin.

* * * * *